US009246031B1

(12) United States Patent
Han et al.

(10) Patent No.: US 9,246,031 B1
(45) Date of Patent: Jan. 26, 2016

(54) SUPRESSING OPTICAL LOSS IN NANOSTRUCTURED METALS BY INCREASING SELF-INDUCTANCE AND ELECTRON PATH LENGTH

(71) Applicants: Sang Eon Han, Albuquerque, NM (US); Samuel Clark, Albuquerque, NM (US)

(72) Inventors: Sang Eon Han, Albuquerque, NM (US); Samuel Clark, Albuquerque, NM (US)

(73) Assignee: STC.UNM, Albuquerque, NM (US)

( * ) Notice: Subject to any disclaimer, the term of this patent is extended or adjusted under 35 U.S.C. 154(b) by 0 days.

(21) Appl. No.: 14/471,124

(22) Filed: Aug. 28, 2014

Related U.S. Application Data

(60) Provisional application No. 61/872,174, filed on Aug. 30, 2013.

(51) Int. Cl.
*H01L 31/0224* (2006.01)
*H01L 31/0735* (2012.01)
*H01L 31/073* (2012.01)
*H01L 21/329* (2006.01)

(52) U.S. Cl.
CPC ...... *H01L 31/022466* (2013.01); *H01L 31/073* (2013.01); *H01L 31/0735* (2013.01)

(58) Field of Classification Search
CPC ............... H01L 31/022425; H01L 31/022466; H01L 31/1884; H01L 31/04; H01L 31/0445; H01L 31/07; H01L 31/073; H01L 31/0735; H01L 25/167; H01L 27/142; H01L 27/3227; H01Q 15/0046
USPC .................................................. 257/E31.126
See application file for complete search history.

(56) References Cited

U.S. PATENT DOCUMENTS

| | | | | |
|---|---|---|---|---|
| 3,668,313 A * | 6/1972 | Dym | ...................... | G06F 3/044 178/18.05 |
| 5,723,912 A * | 3/1998 | Ahrabian et al. | ............ | 307/10.5 |
| 6,512,483 B1 * | 1/2003 | Holden et al. | ................ | 343/701 |
| 7,538,946 B2 * | 5/2009 | Smith et al. | .................... | 359/569 |
| 8,164,506 B2 * | 4/2012 | Sim et al. | ........................ | 342/4 |
| RE43,699 E * | 10/2012 | Anderson et al. | ............. | 343/701 |
| 8,715,839 B2 * | 5/2014 | de Rochemont | .............. | 428/701 |
| 8,754,396 B2 * | 6/2014 | Rogers | ................... | B82Y 10/00 257/40 |
| 8,817,380 B2 * | 8/2014 | Bowers et al. | ................ | 359/642 |
| 8,842,056 B2 * | 9/2014 | Batchelor et al. | ............. | 343/909 |

(Continued)

OTHER PUBLICATIONS

"Structural Forms of Single Crystal Semiconductor Nanoribbons for High Performance Stretchable Electronics," Sun et al., Jan. 25, 2007, The Royal Society of Chemistry, J. Mater. Chem., 2007,17, p. 832-840.*

(Continued)

*Primary Examiner* — Laura Menz
*Assistant Examiner* — Maliheh Malek
(74) *Attorney, Agent, or Firm* — Keith A. Vogt; Vogt IP

(57) ABSTRACT

An optoelectronic device configured to operate at an electromagnetic radiation frequency having metal wire electrodes that are optically transparent as a result of the wires having an effective plasma frequency that is equal to or lower than the electromagnetic frequency at which the device operates. The effective plasma frequency of the wire is lowered by configuring the path of the wire between the terminal ends to be meandering, serpentine, U-shaped and in other non-linear configurations.

17 Claims, 11 Drawing Sheets

(56) References Cited

U.S. PATENT DOCUMENTS

| | | | |
|---|---|---|---|
| 9,105,555 B2* | 8/2015 | Rogers | B82Y 10/00 |
| 2003/0002045 A1* | 1/2003 | Nemat-Nasser et al. | 356/445 |
| 2004/0187917 A1 | 9/2004 | Pichler | |
| 2004/0192082 A1* | 9/2004 | Wagner | H05K 1/0283 439/67 |
| 2004/0227682 A1* | 11/2004 | Anderson | 343/742 |
| 2010/0097048 A1* | 4/2010 | Werner et al. | 324/76.11 |
| 2015/0024201 A1* | 1/2015 | Williams | C01B 31/0446 428/368 |

(Continued)

OTHER PUBLICATIONS

"Light-Controlled Self-Assembly of Semiconductor Nanoparticles into Twisted Ribbons," Srivastava et al., Science Mar. 12, 2010, vol. 327, No. 5971, pp. 1355-1359.*

Han et al; Optical Properties of Metamaterial Serpentine Metal Electrodes; Department of Chemical and Nuclear Engineering, University of New Mexico, Albuquerque, NM; May 7, 2014; US.

Clark et al; Two-Dimensional Metamaterial Transparent Metal Electrodes for Infrared Optoelectronics; Optics Letters; vol. 39, No. 12; pp. 3666-3669; Jun. 15, 2014; Optical Society of America; US.

* cited by examiner

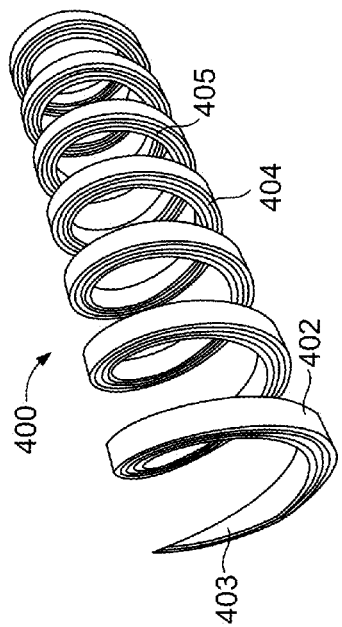
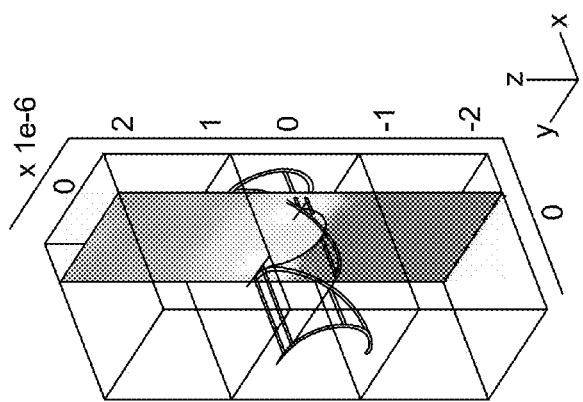
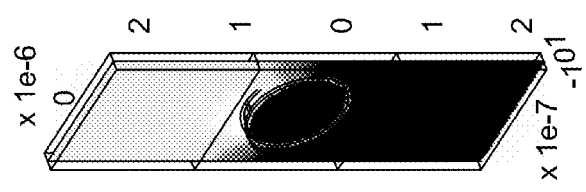
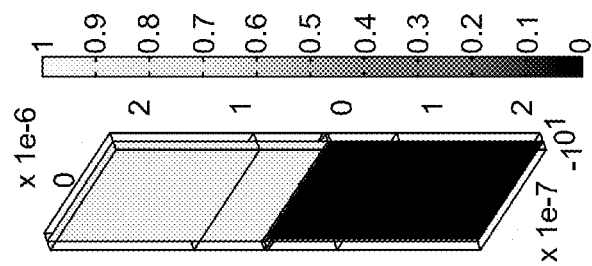
FIG. 4A
FIG. 4B
FIG. 4C
FIG. 4D

SUPRESSING OPTICAL LOSS IN NANOSTRUCTURED METALS BY INCREASING SELF-INDUCTANCE AND ELECTRON PATH LENGTH

RELATED APPLICATIONS

This application claims priority to and the benefit of the filing date of U.S. provisional application Ser. No. 61/872,174 filed Aug. 30, 2013 and incorporated herein for all purposes.

STATEMENT REGARDING FEDERALLY SPONSORED RESEARCH & DEVELOPMENT

Not applicable.

INCORPORATION BY REFERENCE OF MATERIAL SUBMITTED ON A COMPACT DISC

Not applicable.

BACKGROUND OF THE INVENTION

Optical absorption in metals is a fundamental loss process, which is difficult to avoid. When metals are nanostructured, the loss is typically more significant as the surface area increases and the structural size becomes comparable to the penetration depth of optical fields. In particular, when surface plasmons—collective oscillations of electromagnetic fields and free electrons in metal surfaces—are excited, energy dissipation can become even greater.

The absorption in metals often limits the efficiency of metal-based nanoscale devices. For example, in optoelectronic devices, such as nanophotovoltaic devices, light absorption in metal electrodes does not lead to electricity and decreases the efficiency of the device. In light emitting diodes, surface plasmons can be exploited to concentrate light but strong metal absorption remains a major source of losses in plasmon-mediated devices.

The problem of this parasitic absorption becomes critical when ultra-high efficiency devices are desired. Moreover, if the device operates over a broad band as in solar cells, metal absorption needs to be controlled over the whole spectrum of interest and this poses challenges.

When high refractive index materials and metals are used in a device, inserting a thin low index material between them often reduces absorption loss in metals. Moreover, metals are typically opaque at visible frequencies of light and become transparent only at frequencies higher than their plasma frequency, which is typically in the ultraviolet region. This unique optical property of metals has its origin in their free electron gas. Below the plasma frequency, the free electrons follow the electromagnetic oscillation of light and prevent the light from penetrating into the metal.

Oppositely, above the plasma frequency, the light wave oscillation is faster than the electronic movement and light can propagate in the metal. In many optical and optoelectronic applications, the frequency of light is typically well below the plasma frequency of the metals involved and light can penetrate only a few tens of nanometers into the metals.

It is also known that nanostructured metal-dielectric composites can become transparent. However, in this case, it has not yet been clear if light takes paths in the dielectric materials or actually penetrates into the metal. Only in the latter case, it would be possible for light to go into the dielectric regions surrounded by the metal. This property would be extremely useful for certain applications such as photovoltaics where the nanostructured active materials can be surrounded by metal electrodes. However, in typical nanostructured photovoltaic devices, a large surface to volume ratio causes serious losses of electric charge carriers due to their surface recombination.

BRIEF SUMMARY OF THE INVENTION

The various embodiments of the present invention provide methods and structures to render the nanostructured metals transparent using nanophotonic design. In one embodiment, optical absorption in metal nanostructures is reduced over a broad band by increasing the self-inductance of the structures. In other embodiments concerning metal nanocoil arrays, absorptance A is found to scale with self-inductance L as $A \propto L^\alpha$ where $\alpha$ ranges from $-0.5$ to $-1.5$ at high frequencies. In a preferred embodiment, metal nanowires are combined with semiconductor strips so that the fraction of absorption in a semiconductor may increase by more than 60 times by coiling the composite strips due to increased self-inductance. This embodiment of the invention has uses in many metal-based applications that require low loss such as photovoltaics, solid state lighting, and transformation optics.

In another embodiment, the present invention provides non-linear nanostructured metal electrodes that reduce optical losses on flat surfaces. The embodiment concerns two-dimensional structures, which can be fabricated on flat surfaces. In this embodiment, an optoelectronic device that is configured to operate at an electromagnetic radiation frequency includes a non-linear metal wire electrode that has an effective plasma frequency that is equal to or lower than the electromagnetic frequency at which the device is designed to operate. The non-linear configuration of the wire increases self-inductance so that the free electrons in the metal become effectively heavy in response to high frequency light. The heavy electrons do not easily follow the electromagnetic oscillations and the electrode becomes more transparent exhibiting low loss.

BRIEF DESCRIPTION OF THE SEVERAL VIEWS OF THE DRAWINGS

FIG. 4A shows a perspective view of an optoelectronic device arranged as a helical photovoltaic cell consisting of p-type layer, n-type layer and metal electrode FIGS. 4B-4D show calculations of electromagnetic energy density for a helical cell, a tube cell, and a planar cell, respectively.

DETAILED DESCRIPTION OF THE INVENTION

This description is not to be taken in a limiting sense, but is made merely for the purpose of illustrating the general principles of the invention. The scope of the invention is defined by the appended claims.

In one preferred embodiment, the present invention provides an optoelectronic device that decreases absorption in metal nanostructures over a broad band. The invention utilizes the control of self-inductance to hinder the change in the movement of free electrons in metals to increase effective electron mass. For the monolayer array of metal coils 100 shown in FIG. 1, the wire has a rectangular cross section and is helically wound with an outer radius R and a pitch p. These two are related by $$p = 2\pi R \tan\theta, \quad (1)$$

where $\pi/2 - \theta$ is the angle between the wire and the coil axis (z-axis) and $\theta$ is assumed to be small so that $\tan^2\theta \ll 1$.

Figure 1:
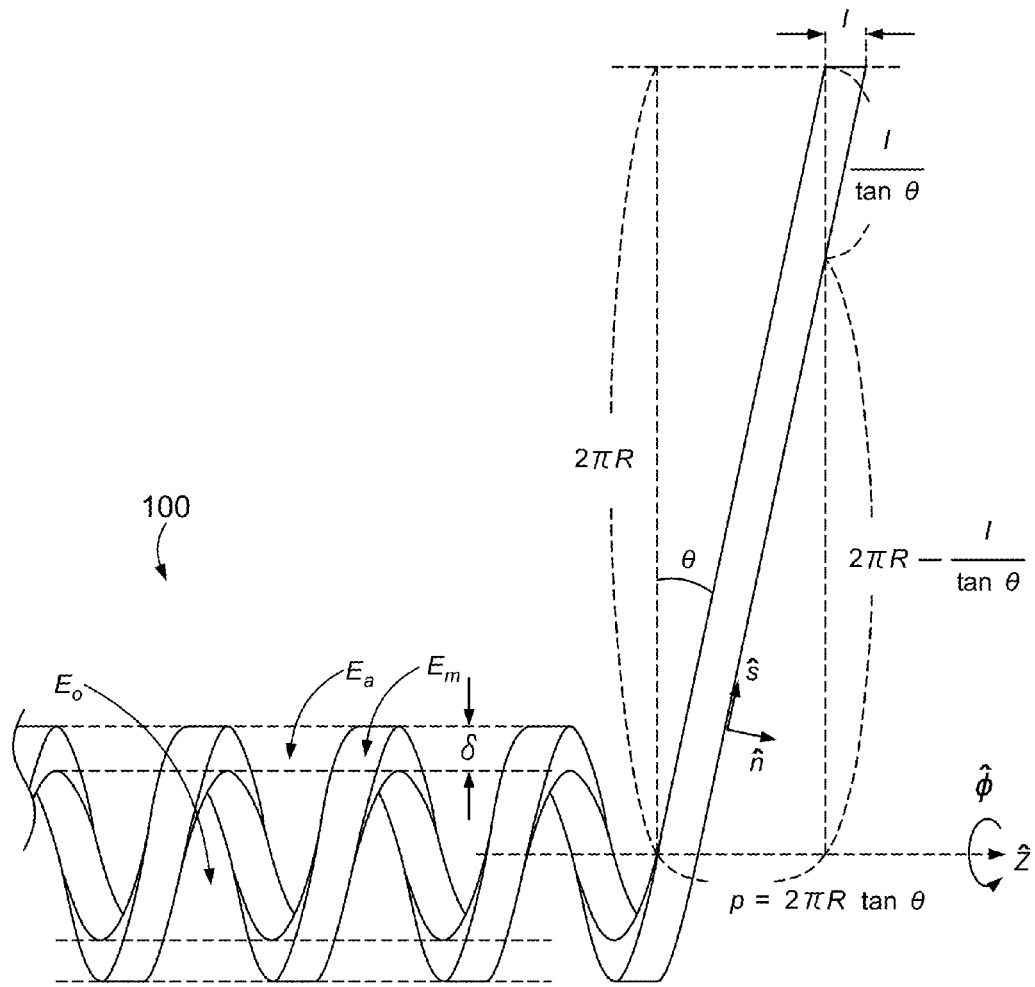
FIG. 1 illustrates a nanocoil with geometrical parameters, cylindrical coordinates, tangential and normal vectors ($\hat{s}$ and $\hat{n}$) as well as electric fields.

As shown in FIG. 1, the coils form a periodic monolayer array 100 with the distance between the neighboring coil axes equal to $\alpha$ and light polarized in the $\hat{z}$ direction is incident in the direction normal to the monolayer surface. When the wavelength of light is much greater than $\alpha$ and p, the coil array is in the metamaterial regime and its optical properties can be described by considering quasi-static field limit. In this limit, optical diffraction is negligible and it is assumed that the electric field inside the metal $E_m$, the air region between the wires of parallel parts $E_\alpha$, and the cylindrical region surrounded by the coil $E_0$, are homogeneous. The relation between the fields in these three regions can be obtained by Maxwell's equations and boundary conditions.

To impose boundary conditions on the fields, unit vectors $\hat{s}$ and $\hat{n}$, which are parallel and normal to the side of the wire, were consider respectively. These are related to cylindrical coordinates by $\hat{s} = -\cos\theta\hat{\Phi} + \sin\theta\hat{z}$ and $\hat{n} = \sin\theta\hat{\Phi} + \cos\theta\hat{z}$. Using the boundary conditions $E_m \cdot \hat{s} = E_\alpha \cdot \hat{s}$ and $\epsilon_m E_m \cdot \hat{n} = E_\alpha \cdot \hat{n}$ where $\epsilon_m$ is the metal dielectric function, it is obtained $$-E_{m,\Phi}\cos\theta + E_{m,z}\sin\theta = -E_{\alpha,\Phi}\cos\theta + E_{\alpha,z}\sin\theta \quad (2)$$

and $$\epsilon_m E_{m,\Phi}\sin\theta + \epsilon_m E_{m,z}\cos\theta = E_{\alpha,\Phi}\sin\theta + E_{\alpha,z}\cos\theta. \quad (3)$$

The potential drop over the pitch p should be constant so that $$E_{m,z}l + E_{\alpha,z}(p-l) = E_0 p, \quad (4)$$

where l is the width of the wire in the $\hat{z}$ direction. It is well-known that, by Amperes law, the $H_z$ field inside the coil is $j_\Phi \delta l/p$ where j is the electrical current density and $\delta (\ll R)$ is the wire thickness. Thus, as shown in FIG. 1, Faraday's law integrated over a cross section of the coil yields:

$$i\omega\mu_0\pi R^2 \frac{j_\Phi \delta l}{p} = \int_0^{2\pi} E_\Phi R d\phi \quad (5)$$

$$= \left(2\pi R - \frac{l}{\tan\theta}\right) E_{\alpha,\Phi} + \frac{l}{\tan\theta} E_{m,\Phi}$$

where it is assumed $e^{-i\omega t}$ dependence of the fields with angular frequency $\omega$. Equations (2)-(5) may then be put in a matrix form:

$$\begin{pmatrix} \tan\theta & -\tan\theta & -1 & 1 \\ -\varepsilon_m & 1 & -\varepsilon_m\tan\theta & \tan\theta \\ 0 & 0 & l - \alpha\tan\theta & p - l \\ l & p - l & 0 & 0 \end{pmatrix} \begin{pmatrix} E_{m,z} \\ E_{a,z} \\ E_{m,\phi} \\ E_{a,\phi} \end{pmatrix} = \begin{pmatrix} 0 \\ 0 \\ 0 \\ pE_0 \end{pmatrix}, \quad (6)$$

where $$\alpha \equiv i\omega\mu_0\pi^2 \frac{\delta l}{p}\sigma$$

and Equation (1) is used and Ohm's law $j_\Phi = \sigma E_{m,\Phi}$ with $\sigma$ being electrical conductivity. This time-dependent conductivity is related to the direct current conductivity $\sigma_0$ by $\sigma = \sigma_0/(1 - i\omega\tau)$, where $\tau$ is the relaxation time. When the frequency is well below the plasma frequency of the metal, it can be assumed that $|\epsilon_m| \gg 1$. In this case, Equation (6) can be solved to give:

$$\frac{E_{m,\phi}}{E_0} \simeq \frac{p\tan\theta}{p - a\tan\theta}. \quad (7)$$

Because it is assumed that $E_m$ is uniform along the wire, the absorptance A of the coil array can be obtained as:

$$A \simeq \frac{\omega}{c} \frac{\int \varepsilon_m^n |E_{m,\phi}|^2 dV}{|E_0|^2 S} \quad (8)$$

$$\simeq \frac{\omega}{c} \varepsilon_m^n \left|\frac{E_{m,\phi}}{E_0}\right|^2 \frac{\delta l}{a\tan\theta}\left(1 - \frac{\delta}{2R}\right),$$

where V is the volume of the wire in a unit cell, S=ap is the surface area of a unit cell exposed to light $\epsilon''_m$ is the imaginary part of $\epsilon_m$, and $E_0$ is assumed to be the same as the incident field.

Figure 2A:
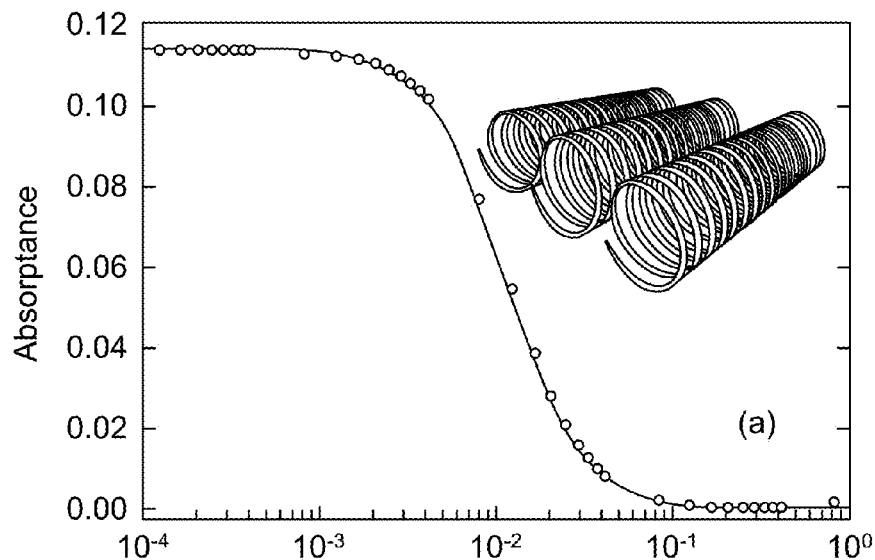
FIG. 2A provides numerical solutions (solid circles) and model predictions (solid line) of absorptance.

FIG. 2A shows comparison of absorptance for an aluminum nanocoil array between the numerical solutions and the model predictions based on Equations (7) and (8). The dielectric function of aluminum was taken from Handbook of Optical Constants of Solids; edited by Palik, E. D. (Academic Press: Orlando, 1985) in the calculations. The analytical predictions agree with numerical solutions and show characteristic features. At low frequencies, the absorptance converges to a constant value given by $$A \to \frac{\sigma_0}{c\varepsilon_0} \tan\theta \frac{\delta l}{a}\left(1 - \frac{\delta}{2R}\right), \tag{9}$$

which is obtained from Equations (7) and (8) with $\alpha \to 0$ and $\epsilon''_m \to \sigma_0/(\epsilon_0\omega)$. At high frequencies, absorptance scales with $\omega^{-2}$. This is associated with the fact that $\epsilon''_m \propto \omega^{-3}$ when $\omega\tau \gg 1$ for Druck metals and $|\alpha|\tan\theta$ becomes comparable to or even larger than p approaching a constant value as the frequency increases. Also, $\alpha/p$ is related to the self-inductance of the coil by:

$$\frac{\alpha}{p} = i\omega\mu_0 \frac{\pi R^2}{p^2}\delta l\sigma = \frac{i\omega}{1 - i\omega\tau}\delta l\sigma_0 L, \tag{10}$$

where $L \equiv \mu_0/(4\pi\tan^2\theta)$ is the self-inductance per unit length of the coil. Defining the effective relaxation time $\tau_{eff} \equiv \tau + \delta l\sigma_0 L \tan\theta$ and, if $\omega\tau \gg 1$, or $>1$, it is obtained from Equations (7), (8), and (10) that $A \propto \omega^{-2} L^{-3/2}$ for $\tau_{eff} \gg 2\tau$ and $A \propto \omega^{-2} L^{-1/2}$ for $\tau_{eff} \ll 2\tau$. Thus it is shown that the suppression of absorption at high frequencies in FIG. 2A results from the self-inductance of the coil.

Figure 2B:
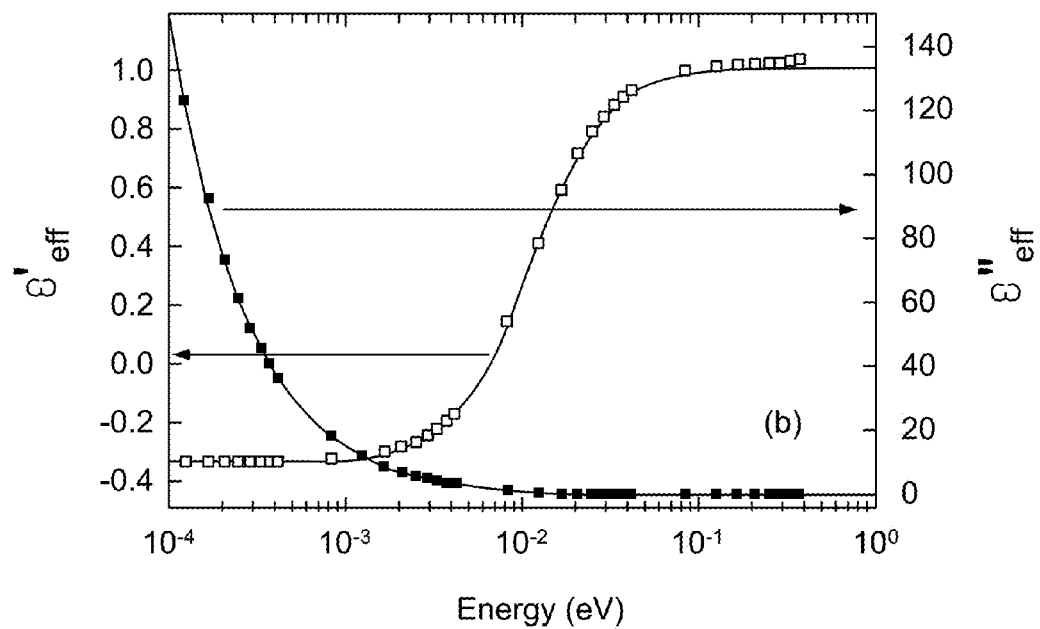
FIG. 2B provides numerical solutions (open square for the real part and solid square for the imaginary part of effective dielectric function ($\epsilon_{\it eff}$) and model predictions (solid line) of $\epsilon_{\it eff}$ for the nanocoil array as a function of photon energy.

The absorption decrease is directly related to the effective dielectric function $\epsilon_{eff}$ of the coil array. The $\epsilon_{eff}$ is obtained from $$\varepsilon_{eff} = 1 + \frac{i\sigma_{eff}}{\varepsilon_0 \omega}, \tag{11}$$

where the effective conductivity $\sigma_{eff}$ relates to the volume average current $\langle j_z \rangle$ and $E_0$ by $\langle j_z \rangle = \sigma_{eff} E_0$. Because $\langle j_z \rangle = f j_z = f \sigma E_{m,z}$ by Ohm's law where $f = \delta l[1-\delta/(2R)]/(\alpha^2 \tan\theta)$ is the filling fraction of the metal nanocoil, the effective conductivity becomes $\sigma_{eff} = f\sigma E_{m,z}/E_0$. Using Equation (10) and the solution of Equation (6) for $E_{m,z}/E_0$ in this expression, when $|\epsilon_m|$ is large, it is found:

$$\sigma_{eff} \simeq f\sigma \frac{p\tan^2\theta}{p - \alpha\tan\theta} = \frac{\sigma_{0,eff}}{1 - i\omega\tau_{eff}}, \tag{12}$$

where $$\sigma_{0,eff} = f\sigma_0 \tan^2\theta \tag{13}$$

is the effective conductivity at vanishing frequency. Plugging Equation (12) into Equation (11), $\epsilon_{eff}$ is evaluated for the model structure and compare to the values extracted from numerical calculations using Phys. Rev. B 2002, 65, 195104 in FIG. 2B. The results are very close to each other and their major features correspond to those of FIG. 2A. The low absorptance at high frequencies correlates with the almost flat dispersion in $\epsilon'_{eff}$ and the very small $\epsilon''_{eff}$. Thus it is shown that the self-inductance of the coil array makes the dispersion in $\epsilon'_{eff}$ small and decreases absorption.

Because self-inductance measures the tendency to oppose a change in the movement of the conduction electrons in the metal nanocoil by Lenz's law, the electrons behave as if their mass is enhanced by self-inductance. The effective mass of electrons, $m_{eff}$, is obtained by considering:

$$\sigma_{0,eff} = \frac{n_{eff} e^2 \tau_{eff}}{m_{eff}}, \tag{14}$$

where $n_{eff} = fn$ is the effective electron density. From Equations (13) with $\sigma_0 = n e^2\tau/m$ and Equation (14), the enhancement of the effective mass becomes:

$$\frac{m_{eff}}{m} = \frac{\tau_{eff}}{\tau\tan^2\theta}. \tag{15}$$

This enhancement factor scales with self-inductance as $m_{eff}/m \propto L^\beta$ where $\beta$ ranges from 1 to 3/2 depending on the relative magnitude between $\tau_{eff}$ and $\tau$. For the example structure of FIG. 2, $m_{eff}/m$ is evaluated to be ~4600.

Figure 3A:
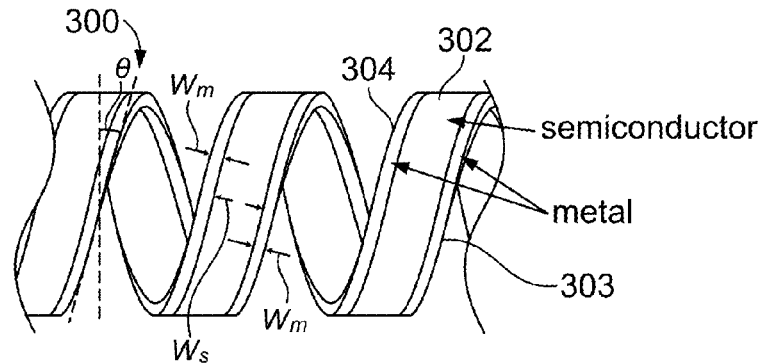
FIG. 3A is a schematic of a coiled metal-semiconductor-metal strip.
Figure 3B:
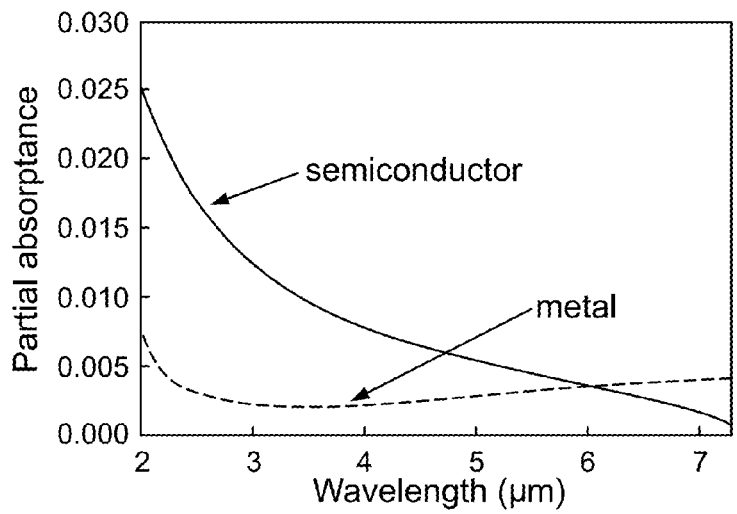
FIG. 3B shows the spectrum of partial absorptance for the monolayer array shown in FIG. 3A.
Figure 3C:
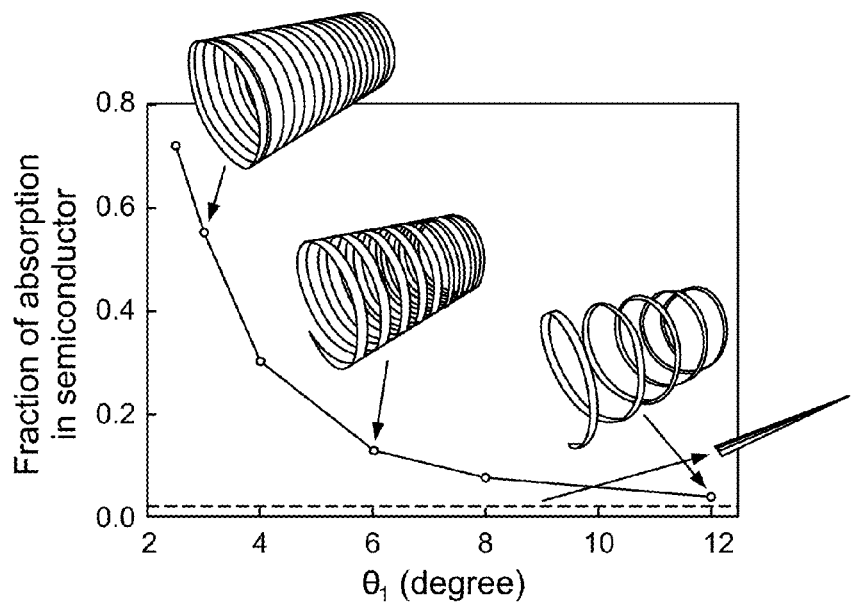
FIG. 3C shows the fraction of absorption in semiconductor, $\rho_s$, as to function of $\theta$ for the nanocoils shown.

The effect of absorption reduction by heavy electrons has applications in nanoscale devices and optoelectronic devices where metals are combined with other materials. For example, in optoelectronic devices, metal structures are used as electrodes on active materials and all metallic parts need to be connected to each other to support electric current. In these cases, absorption loss in metals should be minimized while enhancing absorption in the active materials. Thus, in one embodiment, as shown in FIG. 3A, an optoelectronic device 300 is provided having a semiconductor ribbon 302, metal 303 ribbon, and metal ribbon 304 which are curled into coils as shown. When the coils are arranged in a periodic manner as shown FIG. 2A, the partial absorptance is calculated in semiconductor (indium antimonide) and metal (silver) when $\theta = 3$ degrees and resulting in the spectra above the semiconductor band gap which corresponds to the wavelength of free photons 7.3 μm in FIG. 3B. The spectra show that the absorption enhancement in semiconductor 302 is over a broad band without any sharp features. The smooth character in spectrum is due to the fact that optical diffraction is negligible and no resonance is supported in the spectral band. The increase in metal absorption near 2 μm as the wavelength decreases is due to the diffraction that becomes appreciable at this short wavelength comparable to the structural size. Because the structure is a monolayer whose thickness is small compared to light wavelength, both reflectance and absorptance are small and absorptance can be increased by adding to the number of array layers. An important parameter to characterize the performance of the device is the fraction of absorption in semiconductor 302, $\rho_s$, defined by $$\rho_s \equiv \frac{\int_{\lambda min}^{\lambda max} A_s d\lambda}{\int_{\lambda min}^{\lambda max} A_s + A_m d\lambda}, \tag{16}$$

Where $\lambda_{min}=2$ μm, $\lambda_{max}=7.3$ μm, and $A_s$ and $A_m$ are partial absorptance in the semiconductor and metal, respectively. FIG. 3C shows calculated $\rho_s$ as a function of θ. As θ decreases, the self-inductance of the nanocoils reduces absorption in the metal resulting in increased fraction of absorption in the semiconductor. Compared to a flat strip array with the same periodicity α, the coiled geometry shows $\rho_s$ more than 30 times higher and in other embodiments 60 times higher.

This demonstrates that by controlling the self-inductance in metal nanostructures used with an optoelectronic device the efficiency of the device may be increased. In one application, a nanocoil array as shown above may be deployed wherein a semiconductor strip 302 is used with metal electrodes 303 and 304.

Moreover, the plasma frequency $\omega_p$ of a metal is given by $$\omega_p^2 = \frac{ne^2}{\varepsilon_0 m} \quad (17)$$

where n is the electron density, m the effective mass of electrons, e the electronic charge, and $\varepsilon_0$ the permittivity of vacuum. When a metal is nanostructured with a periodicity much smaller than the wavelength of light and the metallic parts are all connected, the metallic structure behaves like a homogeneous medium and its optical property can be characterized by the effective plasma frequency $\omega_{p,eff}$:

$$\omega_{p,eff}^2 = \frac{n_{eff} e^2}{\varepsilon_0 m_{eff}} \quad (18)$$

where n and m in Equation (17) are replaced by their effective values $n_{eff}$ and $m_{eff}$, respectively. Also, $n_{eff}$ is given by $f \cdot n$ where f is the metal filling fraction and $m_{eff}$ is a function of the structural geometry. The effective plasma frequency of a periodically nanostructured metal can be much lower than the plasma frequency of the homogeneous metal due to two mechanisms: the effective density of electrons is decreased by a low metal filling fraction and the effective mass of electrons increases due to a large self inductance. Self inductance measures the tendency of a metal wire to oppose a change in its current by magnetic effects and this increases the effective mass of electrons.

Even though the effective plasma frequency determines the optical properties of the nanostructured metal as a whole, the question of whether the light of a given frequency passes through the metallic parts inside the structure is not just answered by considering the effective plasma frequency. This effect of transparency in the metallic parts is associated with the movement of the elections in the metal and hence the effective electron mass $m_{eff}$, not with the effective electron density $n_{eff}$. Thus, for this effect, the self-inductance of the metal periodic structure should be large enough so that the electrons are effectively heavy enough and cannot follow the electromagnetic oscillation. Even if the effective electron mass is not large enough, the light can still pass through the metal more effectively than the case of a homogeneous metal when the thickness of the metallic part of the nanostructure is comparable to or less than the penetration depth of the metal.

In yet another embodiment of the invention, a helical coil photovoltaic cell 400 is shown in FIG. 4A. The coiled ribbon 400 consists of two metal electrode layers 402 and 403 sandwiching a semiconductor layer that includes a pn-junction 404 (p-layer) and 405 (n-layer). The ribbons are periodically arranged to form a monolayer coiled ribbon array.

The wavelength of light is 5 μm, which is much larger than the coil diameter of 1 μm. The diameter and the periodicity in the y-direction of the helical and the tube cell are 1 μm and 1.5 μm, respectively. Light of wavelength 5 μm is polarized along the x-axis is incident from the top along the z-axis. The unit cells are periodic in the x and y directions and the dimension unit is in meters. A 20 nm thick InSb cell is sandwiched between the electrodes, which are 10 nm thick each.

For comparison, a planar sheet and a tube array were also considered. The thicknesses of the metal and the semiconductor layer of these arrays are the same as in the helical ribbon. The planar sheet consists of metal-semiconductor-metal multilayers and the tube has the same diameter as the helical ribbon. The periodicity of the coiled ribbon and the tube arrays is also the same. The light is incident in the normal to the surface of the ribbon array, tube array, and the sheet.

FIGS. 4B-4D compare calculated photon energy density for the helical coiled ribbon and the tube for a unit cell of their array and for the planar sheet when light is incident from the top. The comparison shows that the photons pass through the coiled ribbon but they are mostly reflected off the tube array and the sheet. This happens because the coiled ribbons possess a larger self-inductance than the tubes and the sheets.

Figure 5A:
FIGS. 5A-5C show the rate of photon absorption per unit volume for the helical, tubular, and planar cells shown in FIGS. 4B-4D.
Figure 5B:
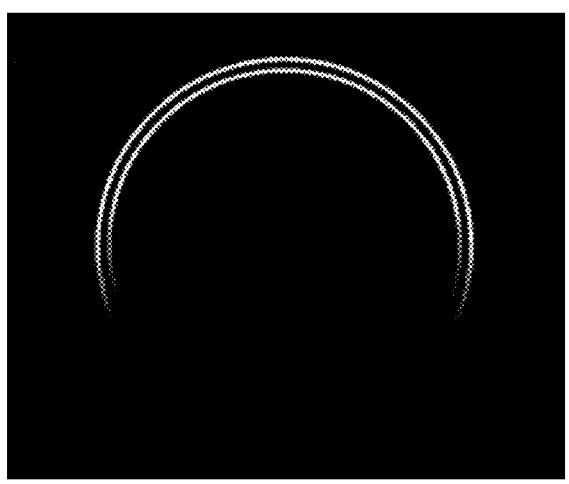
Figure 5C:
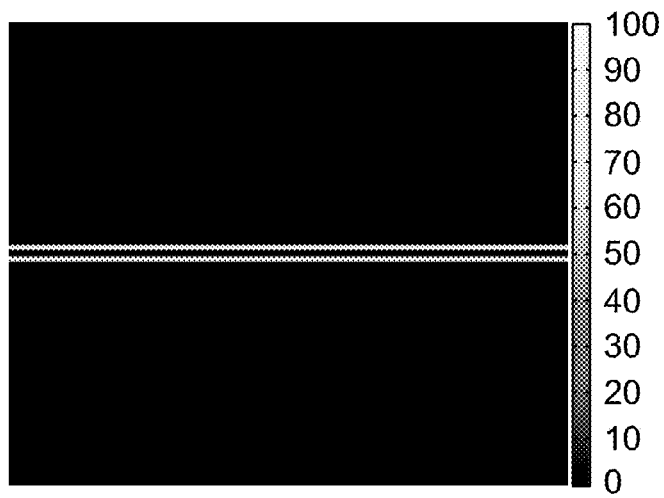

FIGS. 5A-5C show the rate of photon absorption per unit volume for the helical, tubular, and planar cells shown in FIGS. 4B-4D. The comparison shows that light passes through the metal layers and is absorbed by the semiconductor only in the case of the helical ribbon. This indicates that the metal layers in the coiled ribbon have become effectively transparent, which is not possible with the other cases. The absorption rate in the semiconductor of the helical ribbon is roughly an order of magnitude higher than the other structures. This is caused by the large self-inductance of the coiled ribbons, which increases the effective mass of electrons.

To fabricate coiled structures and build devices out of them, self-coiling of patterned multilayer films may be used. This method uses thin crystalline semiconductor bilayers with internal stress due to lattice mismatch and/or other thin isotropic layers such as metals. The internal stress is highly anisotropic and cutting the multilayer film into strips can form nanoribbon helices, such that the strip axis is tilted from the principal force direction of the internal stress.

For photovoltaic applications, the metals act as electrodes that may have terminal ends that are connected to an electrical circuit to produce electric power. In this case, the metal electrodes will collect the charges generated in the semiconductor layer shortly after being separated at the pn-junction with negligible recombination at the surfaces. Since the present invention is capable of rendering metals transparent, it provides solutions to the problem of surface recombination in nanostructured photovoltaic materials. Moreover, the transparent metals can potentially replace transparent conducting oxides, which are relatively expensive and brittle, and have a large electrical resistance.

Another embodiment of the present invention concerns reducing optical losses in nanostructured metal electrodes on flat surfaces. In this embodiment, optical absorption in metal nanowire electrodes are integrated with active layers in optoelectronic devices. Microscopically, the free electrons in the metal become effectively heavy in response to high frequency light when the metal structure bears a large self-inductance. These heavy electrons do not easily follow the electromagnetic oscillations and the electrode becomes more transparent exhibiting low loss. It has been found that this same principle may also be realized in two-dimensional structures, which can be fabricated on flat surfaces.

In the various embodiments of the invention, the metal nanowire electrode has terminal ends with a configuration that defines a non-linear path between the terminal ends. Suitable path geometries that may be used in accordance with the invention include serpentine, U-shaped, meandering and other configurations known to those of skill in the art.

Figure 6A:
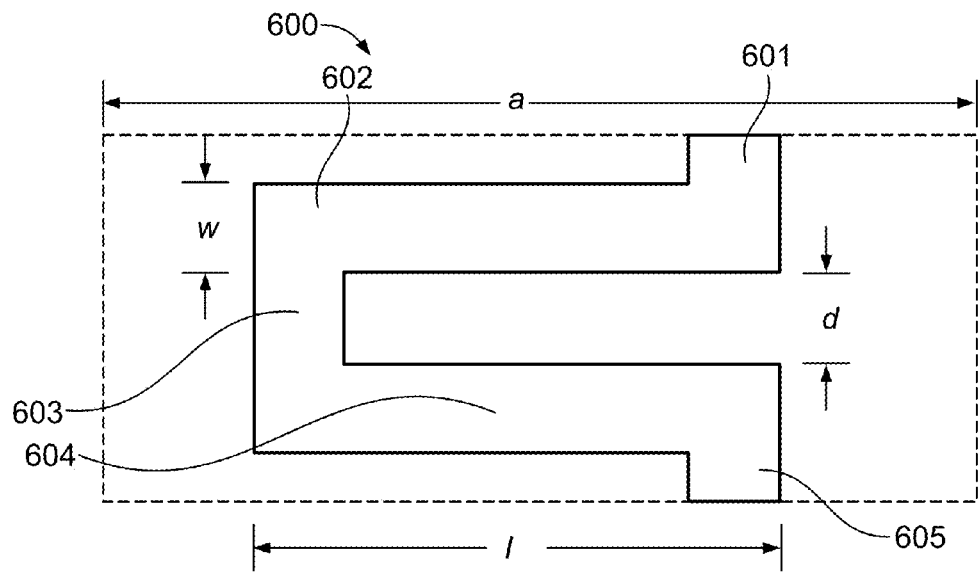
FIG. 6A is a top view of a serpentine unit for use as part of a metal nanostructure electrode.

One preferred embodiment that defines a non-linear path is a repeating unit cell 600 as shown in FIG. 6A. The unit cell 600 repeats in both horizontal and vertical directions with periodicities α and 2d+2w, respectively. Repeating unit cell 600 is comprised of linear segments 601 through 605 that may be connected at right angles. The electrode may form an aluminum nanowire or other suitable metals may be used as well. The cross-section is a square with a side w. The periodicity of the structure is small compared to the wavelength of light. Unpolarized light is normally incident from the top on the structures.

Figure 6B:
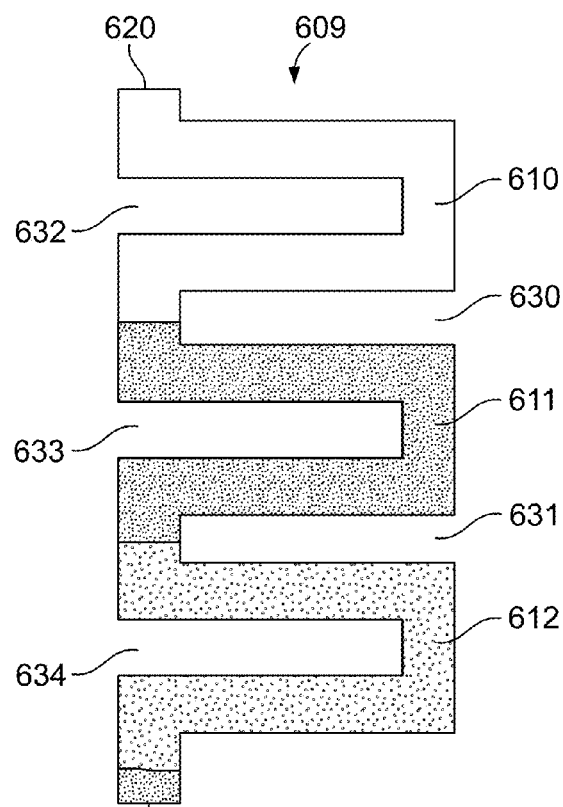
FIG. 6B is a top view of a serpentine metal electrode of one embodiment of the present invention.

As shown in FIG. 6B, electrode 609 is formed by repeating units cells 610 through 612. Electrode 609 has terminal ends 620 and 621 and the path between the terminal ends is not linear. The unit cells do not all need to be the same and can be of a wide variety of configurations; nor do the repeating units need to be the same. Opposingly located openings 630 through 634 are created by the non-linear path.

In addition, as a result of changing the direction of the current flowing in the wire, alternating magnetic fields are created. The magnetic fields oppose electrical current in the metal wire electrode increasing self-inductance.

To determine if the optical properties of the serpentine structures outperform other conventional structures such as a linear or straight wire, transmittance and absorptance were calculated for both the non-linear and straight nanowire structures when the area fraction of the metal wire of w=20 nm is fixed at 0.2.

Figure 7:
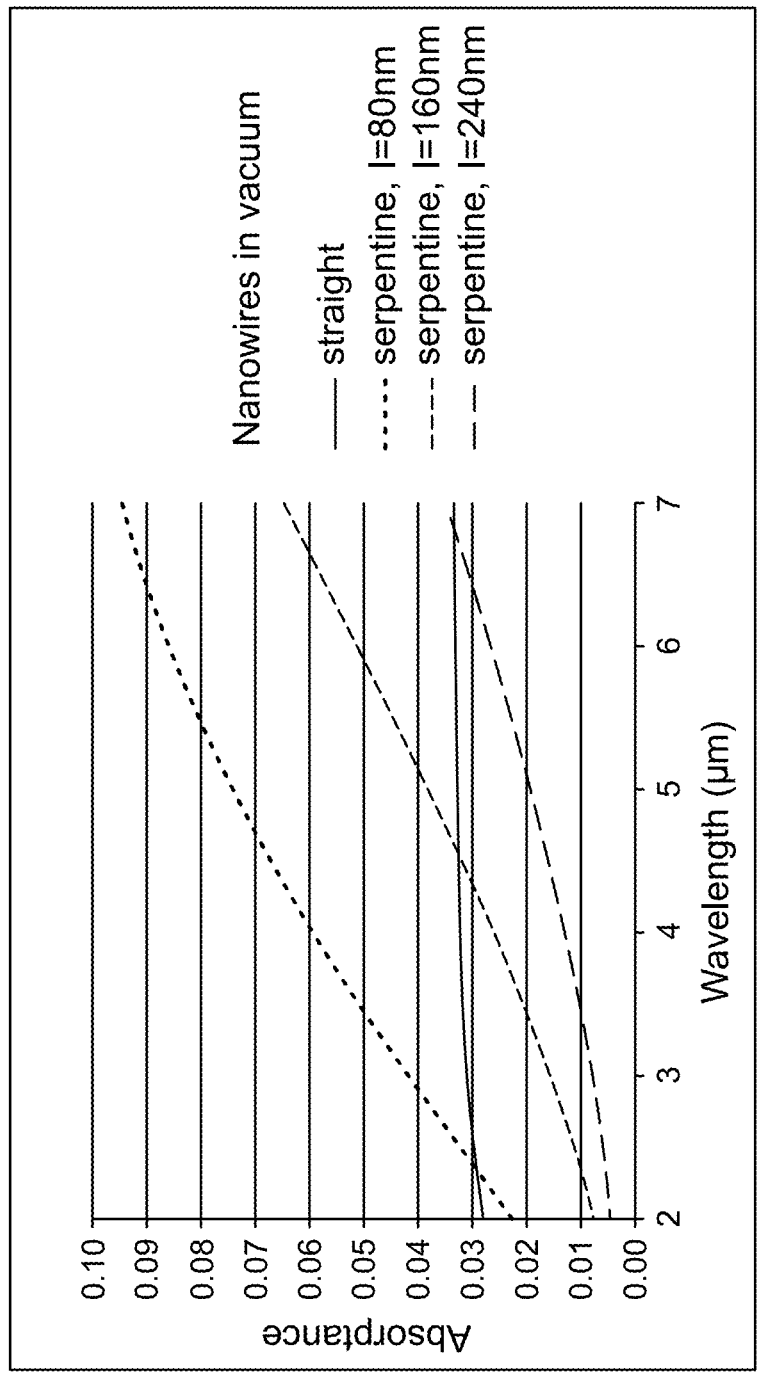
FIG. 7 shows absorptance spectra of various nanowire structures in vacuum.
Figure 8:
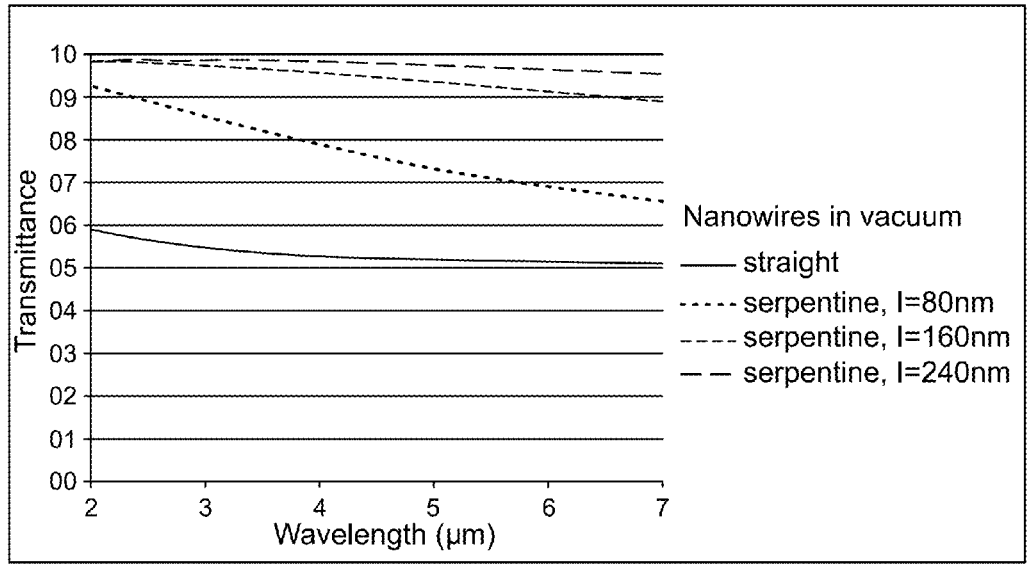
FIG. 8 shows transmittance spectra of various nanowire structures in vacuum.
Figure 9:
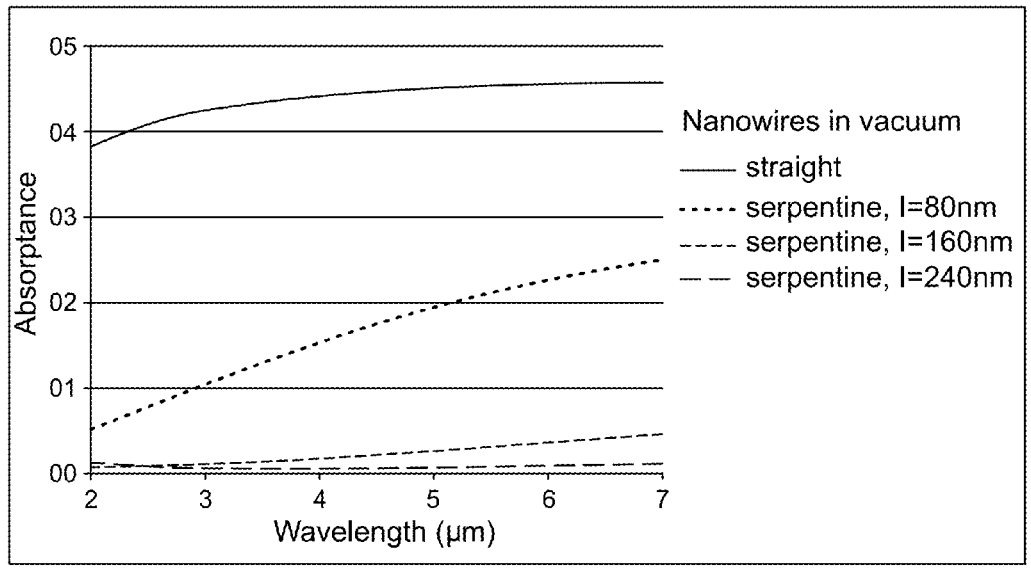
FIG. 9 shows reflectance spectra of various nanowire structures in vacuum.

FIGS. 7 through 9 show the calculation results of the cases where the metal wire was suspended in a vacuum. The geometric configuration of the metal wire had as significant impact on the optical properties of the structures. In general, as the wire structure meanders more, i.e. l increases, both absorption and reflection losses decrease and transmittance increases. Specifically, transmittance increases almost twice from ~0.52 to ~0.97 throughout the spectrum of interest. A detailed analysis shows that this increase is due to the self-inductance enhancement. The reduction in optical losses is possible because of the nanoscale structures. If the metal wire width is greater than the wavelength of light, which happens typically for macroscopic optoelectronic devices, the total optical loss due to reflection and absorption would be close to 20%.

Nanostructuring does not necessarily reduce the optical loss. For example, the straight nanowire structure shows ~48% loss which is even larger than that of the macroscopic counterpart. When the nanowire is slightly meandering, absorption loss increases initially while reflection decreases. Only when the structure is carefully designed, both absorption and reflection losses are expected to decrease. For a serpentine structure with l=240 nm, the total loss is only ~3%.

Figure 10:
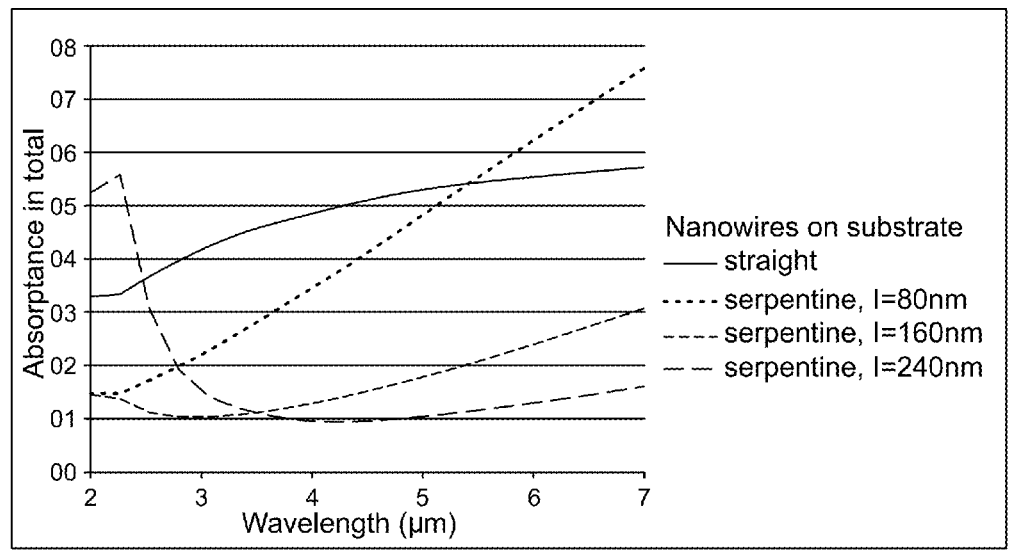
FIG. 10 shows absorptance spectra when metal nanowires are on a semi-infinitely thick substrate with a refractive index of 3.5.

A reduction in optical losses by varying the geometry of the nanowire may also be achieved when the wire is on a substrate, which is typical in optoelectronic devices. The absorptance in the metal nanowires when it is on a substrate is shown in FIG. 10. The refractive index of the substrate is 3.5 which is typical of semiconductors and its thickness is semi-infinite. As the structure varies from a straight nanowire to a meandering or serpentine structure, absorption loss in the metal decreases in general while showing significant spectral dependence.

Figure 11:
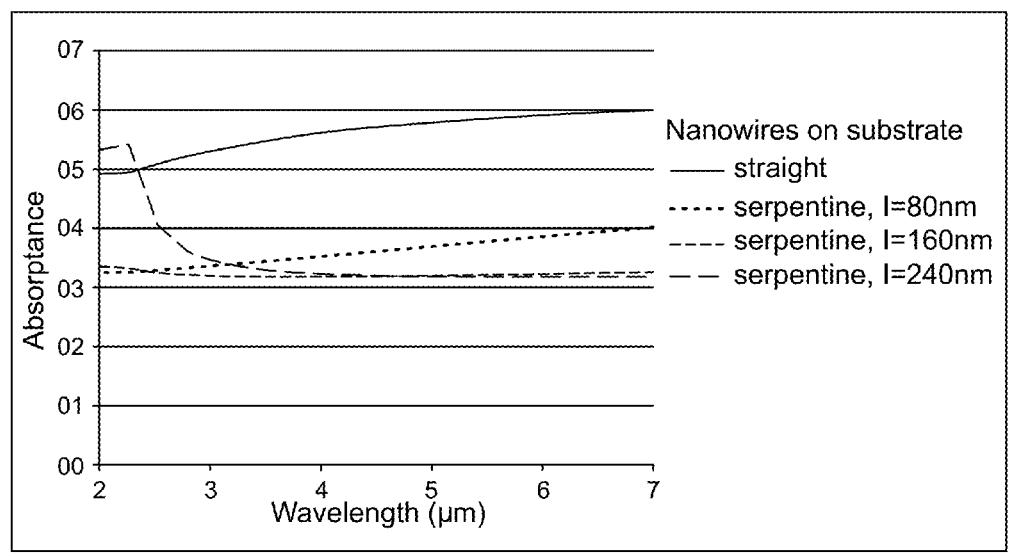
FIG. 11 shows reflectance spectra when metal nanowires are on a semi-infinitely thick substrate with a refractive index of 3.5.

Reflectance spectra shown in FIG. 11 reveal that reflection loss is more than an order of magnitude greater than absorption loss in metal nanowire structures. Without the nanowires, reflectance would be 0.31. Thus for macroscopic metal wires occupying 20% of the area they would exhibit reflectance of ~0.45. The straight nanowire has reflectance larger than this macroscopic case. However, the serpentine structure with l=240 nm shows reflectance of ~0.32 which is very close to the value for a bare substrate.

When an antireflection coating that covers both the metal nanowires and the substrate is present, reflection loss can be minimized. When it is negligible, the dominant loss will be due to absorption. In this case, with the non-linear, serpentine metal nanowires, the absorption loss would be very small. Thus, metal nanowire electrodes having non-linear path configurations, such as a serpentine path, exhibit almost negligible optical losses even with coverage of 20%, while the macroscopic counterparts would have ~20% optical losses.

Figure 12A:
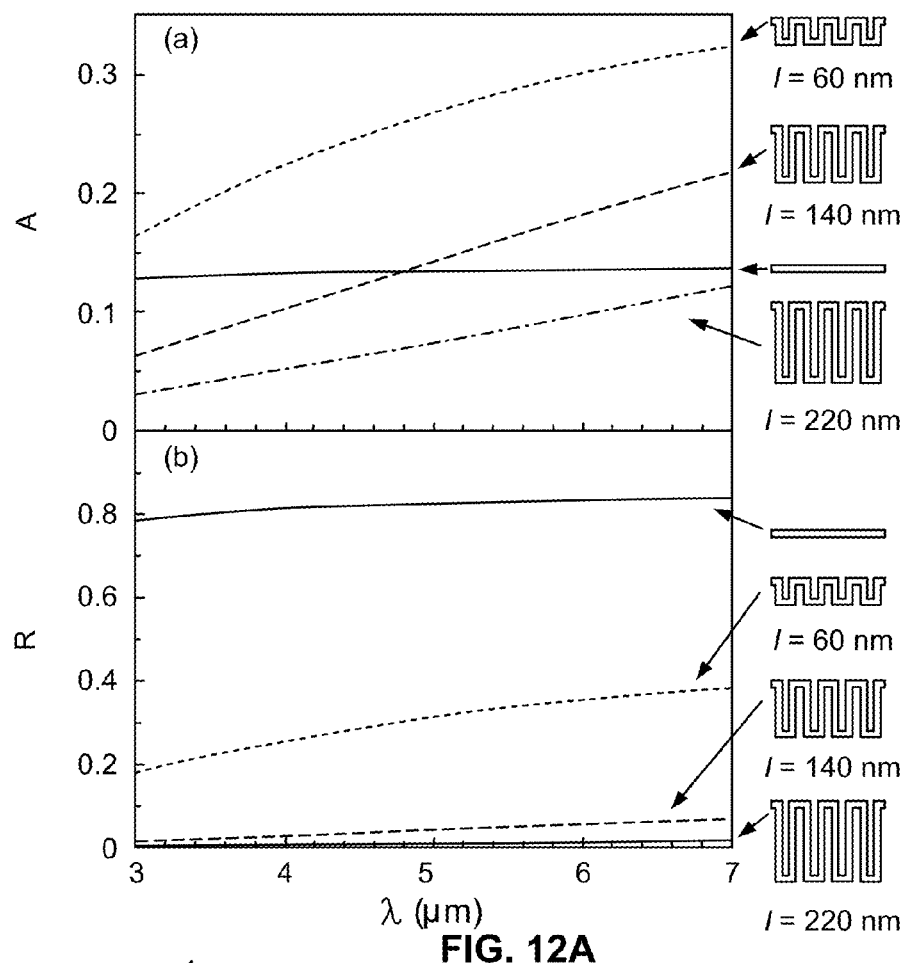
FIG. 12A shows absorptance and reflectance spectra of various nanowire structures in vacuum.

FIG. 12A shows that, for light polarized in the y direction, reflectance decreases dramatically as l increases. Compared with straight wires, the serpentine structure with l=220 nm shows a reflectance decrease of almost 0.8. Absorptance increases initially as the straight wires start meandering but drops below the straight wires' absorptance at l=220 nm over the whole spectrum of interest.

Figure 12B:
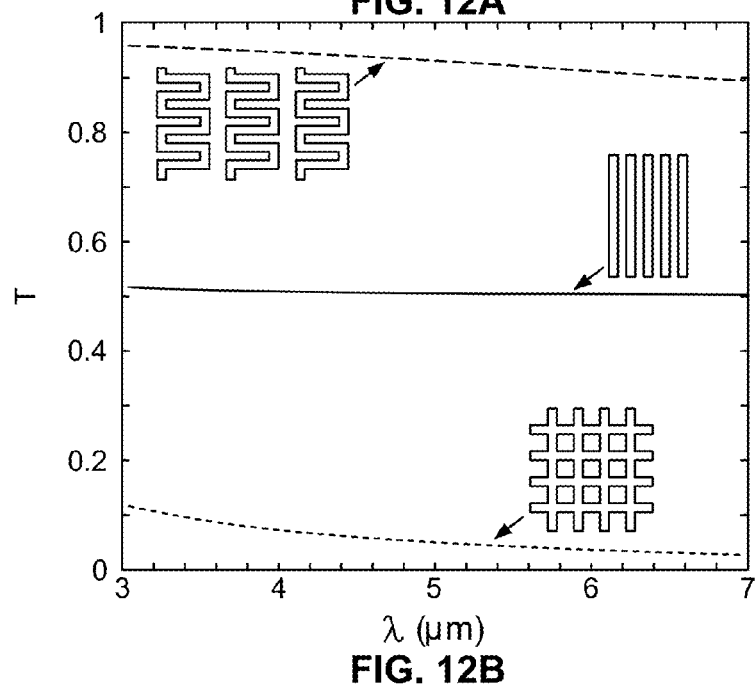
FIG. 12B shows transmittance spectra of a serpentine wire array, straight wire array, and a grid structure of Aluminum in vacuum for unpolarized light.
Figure 13A:
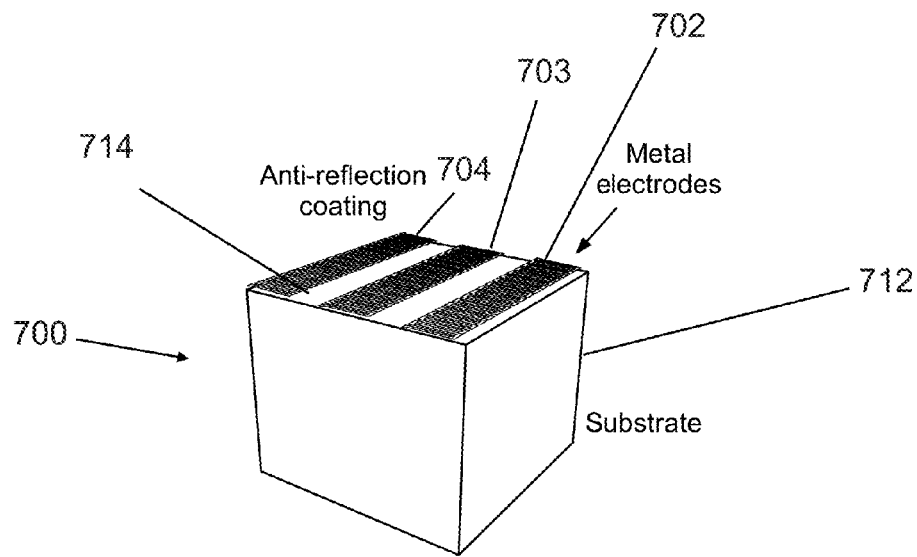
FIG. 13A shows a schematic of Aluminum electrodes on an indium antimonide substrate with a silicon nitride Anti-Relection coating.

The results shown in FIGS. 12A and 12B demonstrate that embodiments of the present invention may be used in optoelectronic devices such as infrared optoelectronics. Depending on the application, as shown in FIG. 13A, an optoelectronic device 700 may have electrodes 702 through 704, which can be placed on a glass substrate 712 of a low refractive index or on a photoactive material, which typically possesses a high refractive index. One useful substrate material that may be used is indium antimonide (InSb), which has a high refractive index of 4.0-4.4 and is absorptive in the desired wavelength range. The nanostructured metal electrodes are placed on a semi-infinite InSb substrate and an antireflection (AR) coating 714 with a refractive index of 1.9 is applied at the top of the structure with a coating thickness of 660 nm measured from the InSb-AR interface to the AR-air interface as shown in FIG. 13A.

Figure 13B:
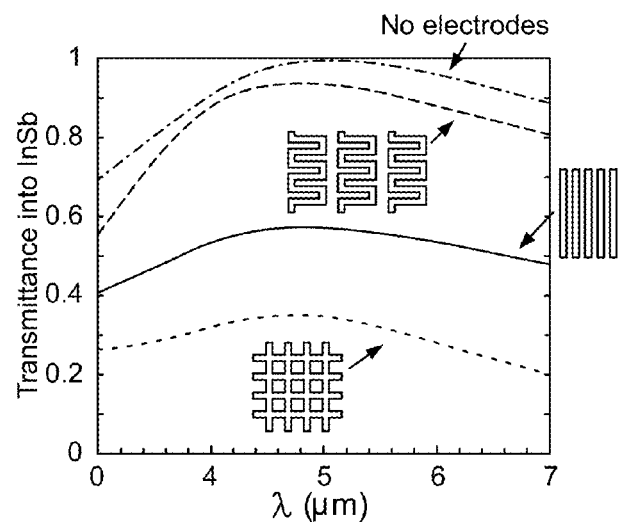
FIG. 13B shows spectrum of transmittance into the substrate when the three metal nanostructures shown in FIG. 12B are arranged as shown in FIG. 13A.

For this layered structure, FIG. 13B shows the spectra of the transmittance into the InSb substrate for the unpolarized light for the three metal electrodes in FIG. 12B. The serpentine structure shows the smallest losses, and the ordering of the transmittance into InSb of the three structures is the same as that of the transmittance in FIG. 12B.

However, the transmittance into the substrate is higher or lower than the transmittance in FIG. 12B, depending on the metal structures. For example, while for the grid structure the transmittance into InSb is significantly higher than the transmittance of the structure in vacuum, the opposite is true for the serpentine structure. This indicates that, for high index substrates, it is not enough to consider the optical properties of nanostructured metals suspended in vacuum because the interaction between the metal structures and the other layers is not negligible. The optimum AR coating can be different in the presence of the metal nanoelectrodes. For example, while the AR coating achieves perfect anti-reflection at λ=5.1 μm without metal electrodes, for the serpentine structure, the peak at the maximum transmission into InSb shifted to λ=4.8 μm, and the maximum transmission is far from perfect.

Figure 13C:
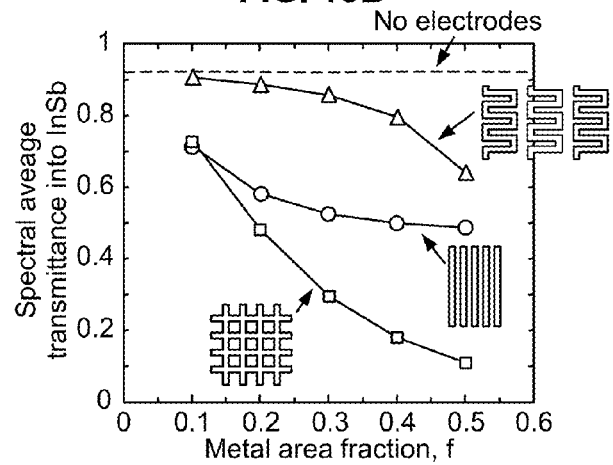
FIG. 13C shows metal area fraction dependence of the spectral average transmittance into the substrate for the three metal electrode structures shown in FIG. 12B and are arranged as shown in FIG. 13A.

To determine the metal area fraction dependence of the losses, the transmission into InSb over the spectrum were averaged for the three different metal nanostructures at different area fractions as shown in FIG. 13C. In general, as the metal fraction increases, transmittance into InSb decreases for all three structures. At the extreme limit, where the area fraction vanishes, the transmittance is 0.92 as indicated by a dashed line in FIG. 13C. The serpentine structure exhibits much higher transmittance into InSb than the other two when the metal area fraction varies from 0.1 to 0.5. This is because the small effective conductivity and the modest self-inductance of the serpentine structure reduce the optical losses.

Even at a relatively large area fraction of 0.3, the optical losses due to the serpentine structure are only 0.065. While this loss is similar to that achieved with the smaller metal coverage structures where the periodicity was comparable to the wavelength, the sheet resistance $R_S$ of the serpentine structure is significantly higher. For the serpentine structure, the sheet resistance is $R_s = \rho_0 \alpha^2 f/(hw^2) = 430$ Ω/sq where $\rho_0$ is the DC resistivity of the metal modified by considering the surface and the grain boundary electronic scattering. This sheet resistance is similar to that of electrodes made of carbon nanotubes and graphenes, but the use of higher-conductivity metals such as silver or copper can reduce the sheet resistance.

In other embodiments, the present invention provides optoelectronic devices configured to operate at an electromagnetic radiation frequency. The devices comprise metal wire electrodes that may be made of materials such as Au, Ag, Al, Cu, and alloys such as TiAu. The metal wire has an effective plasma frequency when in a linear configuration, which is greater than the electromagnetic frequency of the device. When acting as an electrode, the metal wire electrode is configured into a non-linear configuration so as to create an effective plasma frequency that is equal to or lower than the electromagnetic frequency of the device.

In other embodiments, metal wire electrodes may be configured as coils, which may also be helically coiled ribbons. The coil or coils may have a diameter equal to or less than 1 micron and a periodicity equal to or less than 1.5 microns. The winding angle may be equal to or less than 12 degrees.

In an alternate embodiment, the optoelectronic device is as helically coiled ribbon photovoltaic cell having a ribbon that is helically-coiled shape and the ribbon has a cross-section comprising two metal electrode layers sandwiching a semiconductor layer that may be InSb, InAs, GaSb, PbS, HgCdTe, HgZnTe, PbSe, PbTe, Bi2Te3 or GaSb/InAs superlattices. The semiconductor layer may also include a pn-junction, which may comprise InSb.

Additional embodiments include a device that may be an array of multiple helical coiled ribbon photovoltaic cells periodically arranged to form a monolayer coiled ribbon array on a substrate. Each photovoltaic cell comprises a ribbon having a helically-coiled shape. The ribbon may have a cross-section comprising two metal electrode layers sandwiching a semiconductor layer that includes a pn-junction.

The optoelectronic device of the present invention may further comprise a metal wire electrode having a first terminal end and a second terminal end that defines a path between the terminal ends. The path may be configured as a non-linear path that decreases the effective conductivity of the metal wire electrode as compared to a linear path between the terminal ends.

Other embodiments include configuring the path to have an inductance that is greater than the inductance of a linear wire. This path may be U-shaped or even a serpentine path that is U-shaped. The serpentine path may also be comprised of linear segments, which may further be connected at right angles.

In other embodiments, the optoelectronic device has absorption and reflection loss that is equal to or no more than 3 percent. The spectral average absorption and reflection loss is equal to or more than 3 percent. In other embodiments, the metal wire electrode covers up to 30 percent of a substrate and the absorption and reflection loss is equal to or no more than 3 percent.

While the present invention has a potential to be widely used for scientific assessment and management, the foregoing written description of the invention enables one of ordinary skill to make and use what is considered presently to be the best mode thereof. Those of ordinary skill will understand and appreciate the existence of variations, combinations, and equivalents of the specific embodiment, method, and examples herein. The invention should therefore not be limited by the above described embodiments, methods, and examples, but by all embodiments and methods within the scope and spirit of the invention as claimed.

What is claimed is:

1. A photoconductive detector configured to operate at an electromagnetic radiation frequency comprising:
   one or more ribbons having a helically-coiled shape, said one or more ribbons having a cross-section comprising two metal wire electrodes sandwiching a semiconductor layer;
   said metal wire electrodes having an effective plasma frequency when in a linear configuration, said effective plasma frequency greater than said electromagnetic frequency; and
   said metal wire electrodes in a non-linear configuration, said non-linear metal wire electrodes having an effective plasma frequency that is equal to or lower than the electromagnetic frequency.

2. The device of claim 1 wherein said coil has a diameter equal to or less than 1 micron and a periodicity equal to or less than 1.5 microns.

3. The device of claim 1 wherein said coil has a winding angle equal to or less than 12 degrees.

4. An optoelectronic device configured to operate at an electromagnetic radiation frequency comprising:
   an array having one or more helical coiled ribbon photovoltaic cells arranged on a substrate;
   each photovoltaic cell comprises a ribbon having a cross-section comprising two metal wire electrodes sandwiching a semiconductor layer;
   said metal wire electrodes having an effective plasma frequency when in a linear configuration, said effective plasma frequency greater than said electromagnetic frequency; and
   said metal wire electrodes in a non-linear configuration, said non-linear metal wire electrodes having an effective plasma frequency that is equal to or lower than the electromagnetic frequency.

5. The optoelectronic device of claim, further comprising:
   a metal wire electrode having a first terminal end and a second terminal end and defining a path between said terminal ends; and
   said path is configured as a serpentine path that creates a plurality of alternating magnetic fields that oppose electrical current in said metal wire electrode to decrease the effective conductivity of said metal wire electrode as compared to a linear path between said terminal ends.

6. The device of claim 5 wherein said serpentine path has an inductance that is greater than the inductance of a linear wire.

7. The device of claim 5 wherein said serpentine path is U-shaped.

8. The device of claim 5 wherein said serpentine path is comprised of linear segments.

9. The device of claim 8 wherein said linear segments are connected at right angles.

10. The device of claim 5 having an absorption and reflection loss that are equal to or no more than 3 percent.

11. The device of claim 5 wherein having an spectral average absorption and reflection loss that are equal to or no more than 3 percent.

12. The device of claim 5 wherein said metal wire electrode covers up to 30 percent of a substrate and having an absorption and reflection loss that are equal to or no more than 3 percent.

13. The device of claim 12 wherein said substrate is InSb, InAs, GaSb, PbS, HgCdTe, HgZnTe, PbSe, PbTe, Bi2Te3 or GaSb/InAs superlattices.

14. The detector of claim 1 wherein the semiconductor material is InSb, InAs, GaSb, PbS, HgCdTe, HgZnTe, PbSe, PbTe, Bi2Te3 or GaSb/InAs superlattices.

15. The optoelectronic device of claim 4 wherein said one or more helical coiled ribbon photovoltaic cells are periodically arranged to form a monolayer coiled ribbon array on a substrate.

16. The optoelectronic device of claim 4 further including a pn junction.

17. The optoelectronic device of claim 16 wherein the pn junction is InSb, InAs, GaSb, PbS, HgCdTe, HgZnTe, PbSe, PbTe, Bi2Te3 or GaSb/InAs superlattices.

* * * * *